United States Patent [19]
Hung et al.

[11] Patent Number: 5,937,298
[45] Date of Patent: Aug. 10, 1999

[54] METHOD FOR MANUFACTURING ELECTROSTATIC DISCHARGE PROTECTION DEVICE

[75] Inventors: Tsung-Yuan Hung, Tainan; Yao-Pi Hsu, Chupei, both of Taiwan

[73] Assignee: United Semiconductor Corp., Taichung, Taiwan

[21] Appl. No.: 08/957,811

[22] Filed: Oct. 27, 1997

[30] Foreign Application Priority Data

Sep. 2, 1997 [TW] Taiwan .................................. 86112562

[51] Int. Cl.[6] .................................................. H01L 21/336
[52] U.S. Cl. ............................................................ 438/286
[58] Field of Search ................................... 438/238, 275, 438/279, 281, 286

[56] References Cited

U.S. PATENT DOCUMENTS 4,874,713 10/1989 Gioia .......................................... 437/34
5,262,344 11/1993 Mistry ....................................... 437/57
5,413,969 5/1995 Huang ...................................... 437/200

*Primary Examiner*—Joni Chang
*Attorney, Agent, or Firm*—Finnegan, Henderson, Farabow, Garrett & Dunner, L.L.P.

[57] ABSTRACT

A method for forming electrostatic discharge protection devices that includes the steps of forming a transistor, which comprises a gate, a source region, a drain region, on a semiconductor substrate. Then, an insulating layer is formed over the transistor. Next, the insulating layer above the gate is removed, which represents one characteristic of this invention. Subsequently, a photolithographic processing operation is performed to form a photoresist layer over the substrate. The photoresist layer covers the insulating layer above the gate and the drain region while exposing the insulating layer above the source region. Thereafter, using the photoresist layer as a mask, the exposed insulating layer above the source region is removed. Next, the photoresist layer is removed. Finally, a self-aligned silicide processing operation is performed to form a silicide layer over the gate and the source region. Since no silicide layer is formed over the drain terminal, burnout of the drain terminal due to overheating can be avoided.

8 Claims, 5 Drawing Sheets

METHOD FOR MANUFACTURING ELECTROSTATIC DISCHARGE PROTECTION DEVICE

BACKGROUND OF THE INVENTION

1. Field of Invention

The present invention relates to a type of electrostatic discharge (ESD) protection device and its manufacturing method. More particularly, the present invention relates to a type of electrostatic discharge protection device and associated manufacturing method that uses a self-aligned silicide (Salicide) process, and is capable of preventing burnout of the drain terminal due to overheating.

2. Description of Related Art

In the manufacturing of electrostatic discharge protection devices that use a self-aligned silicide (Salicide) process, there are two salicide block layout designs. The purpose of the block layout designs is to avoid the formation of a silicide layer over the drain terminal. The first design is to block the drain terminal only, and the second design is to block the drain terminal, the source terminal as well as the gate terminal. Both designs are described in detail below.

FIGS. 1A through 1D are a series of cross-sectional views showing the progression of steps in the manufacturing of a conventional electrostatic discharge protection device that uses a self-aligned silicide process and employing a first block design. First, as shown in FIG. 1A, a semiconductor substrate 10 that has a gate 11, a source region 12, a drain region 13, already formed thereon is provided. Then, a cap oxide layer 14 is formed over the gate 11, the source region 12 and the drain region 13. The cap oxide layer 14 can be, for example, an undoped silicon dioxide ($SiO_2$) layer, and preferably an oxide layer deposited using a plasma-enhanced chemical vapor deposition (PECVD) method with silane ($SiH_4$) or tetraethyl orthosilicate (TEOS) as the base material. Next, as shown in FIG. 1B, a photoresist layer 15 is formed over the cap oxide layer 14 using photolithographic processes. Thereafter, as shown in FIG. 1C, the cap oxide layer 14 is etched using the photoresist layer 15 as a mask to expose the gate 11, the source region 12 and a portion of the drain region 13. Finally, as shown in FIG. 1D, a self-aligned silicide processing operation is performed to form a silicide layer 16 above the exposed gate 11, the source region 12 and a portion of the drain region 13. It is obvious from the above method that a portion of the drain region 13 is covered by a silicide layer 16 in the final structure.

FIG. 2A through 2C are a series of cross-sectional views showing the progression of steps in the manufacturing of a conventional electrostatic discharge protection device that uses a self-aligned silicide process and employing a second block design. First, as shown in FIG. 2A, a semiconductor substrate 20 that has a gate 21, a source region 22, a drain region 23, a field oxide layer 24, already formed thereon is provided. Then, a cap oxide layer 25, for example, an undoped silicon dioxide ($SiO_2$) is formed over the substrate 20. Next, as shown in FIG. 2B, a photoresist layer 26 is formed over the cap oxide layer 25 using photolithographic processes. Next, as shown in FIG. 2C, the cap oxide layer 25 is etched to leave a residual cap oxide layer 25 above the gate 21, the source region 22 and the drain region 23 using the photoresist layer 26 as a mask. Thereafter, subsequent self-aligned silicide processing operation is performed.

A number of defects can be found for the above two self-aligned silicide block layout designs. For the first block layout design shown in FIG. 1A through 1D, the cap oxide layer only blocks a portion of the drain terminal. When a self-aligned silicide processing operation is performed, a silicide layer can still be formed in the area above the drain region neighboring the gate terminal. Therefore, whenever a large stress voltage is applied to the drain terminal, a large conducting current will flow through due to the presence of a low resistant silicide layer above the drain terminal. The passing of a large current through the drain terminal next to the gate generates a lot of heat that may result in the burnout of drain terminal. This can cause the malfunctioning of the electrostatic discharge protection device. On the other hand, for the second block layout design shown in FIG. 2A through 2C, the cap oxide layer blocks the gate, the source and the drain terminal entirely. Due to the presence of an oxide layer over the gate and the source terminal, a silicide layer is difficult to establish itself thereon. This may lead to a high gate and source terminal resistance. A high gate and source terminal resistance can affect the input and output timing characteristic of a circuit.

In light of the foregoing, there is a need in the art for an improved method for producing electrostatic discharge protection devices.

SUMMARY OF THE INVENTION

Accordingly, the present invention is directed to provide a type of electrostatic discharge protection device and associated manufacturing method that is capable of maintaining a good reliability even when device dimensions are reduced, and which can rectify some of the defects of the device produced by a conventional method.

To achieve these and other advantages and in accordance with the purpose of the invention, as embodied and broadly described herein, the invention provides a method for forming electrostatic discharge protection devices. The method includes the steps of first forming a transistor on a semiconductor substrate. The transistor comprises a gate, a source region and a drain region. Then, an insulating layer is formed over the transistor. Next, the insulating layer above the gate is removed, which represents one characteristic of this invention. Subsequently, a photolithographic processing operation is performed to form a photoresist layer over the substrate. The photoresist layer covers the insulating layer above the gate and the drain region while exposing the insulating layer above the source region. Thereafter, using the photoresist layer as a mask, the exposed insulating layer above the source region is removed. Next, the photoresist layer is removed. Finally, a self-aligned silicide processing operation is performed to form a silicide layer over the gate and the source region.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
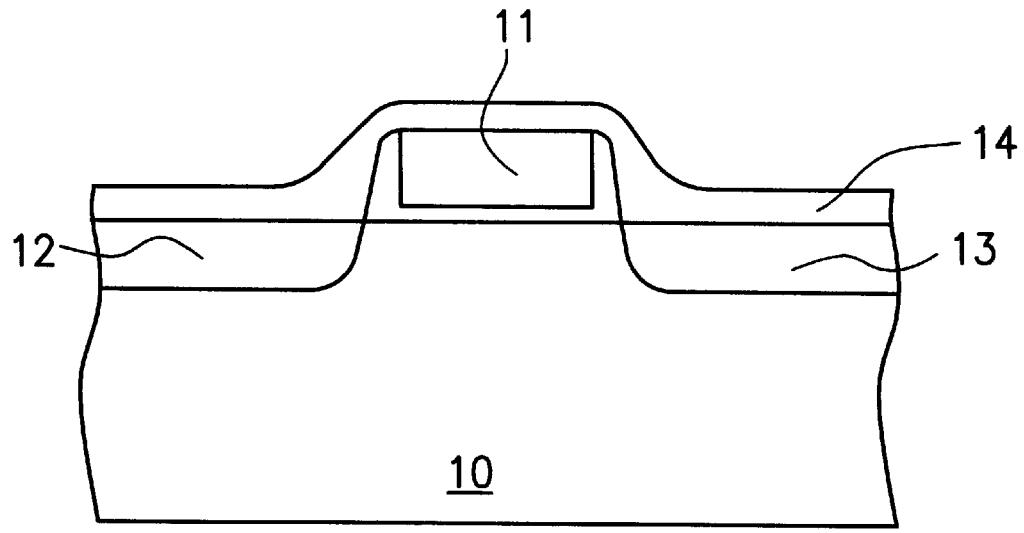
FIGS. 1A through 1D are a series of cross-sectional views showing the progression of steps in the manufacturing of a conventional electrostatic discharge protection device that uses a self-aligned silicide process and employing a first block design.
Figure 1B:
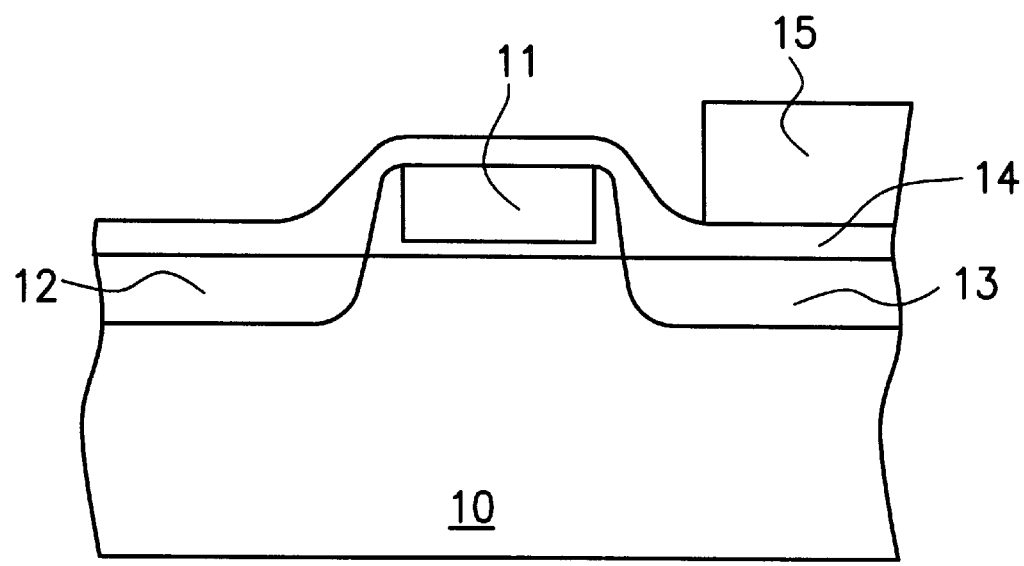
Figure 1C:
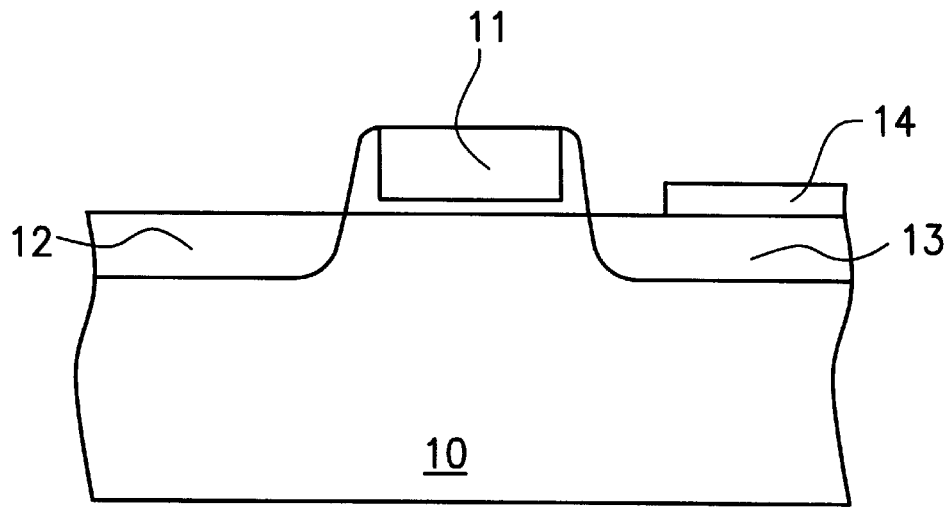
Figure 1D:
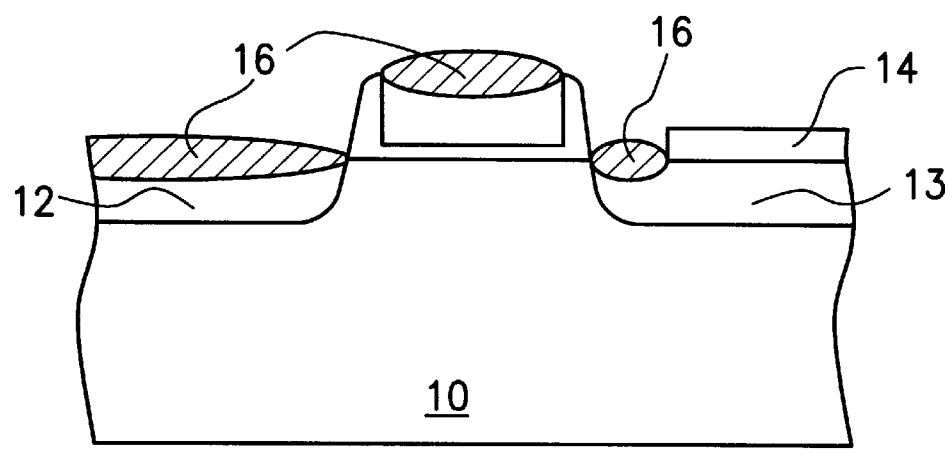
Figure 2A:
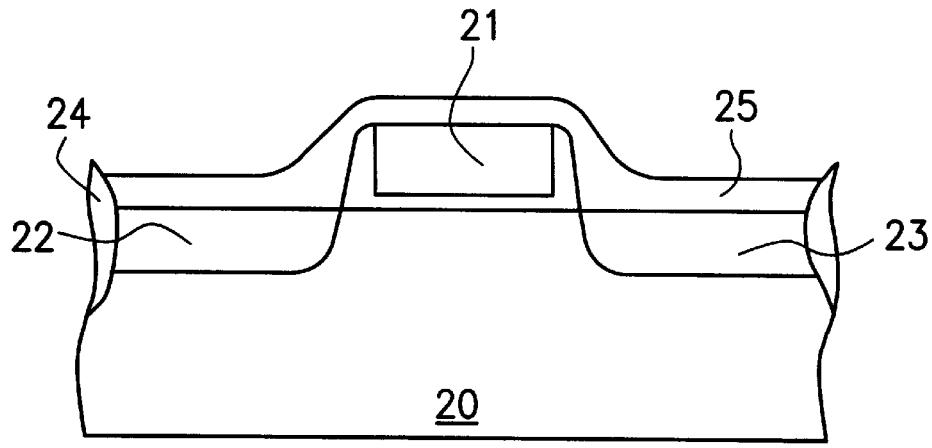
FIG. 2A through 2C are a series of cross-sectional views showing the progression of steps in the manufacturing of a conventional electrostatic discharge protection device that uses a self-aligned silicide process and employing a second block design.
Figure 2B:
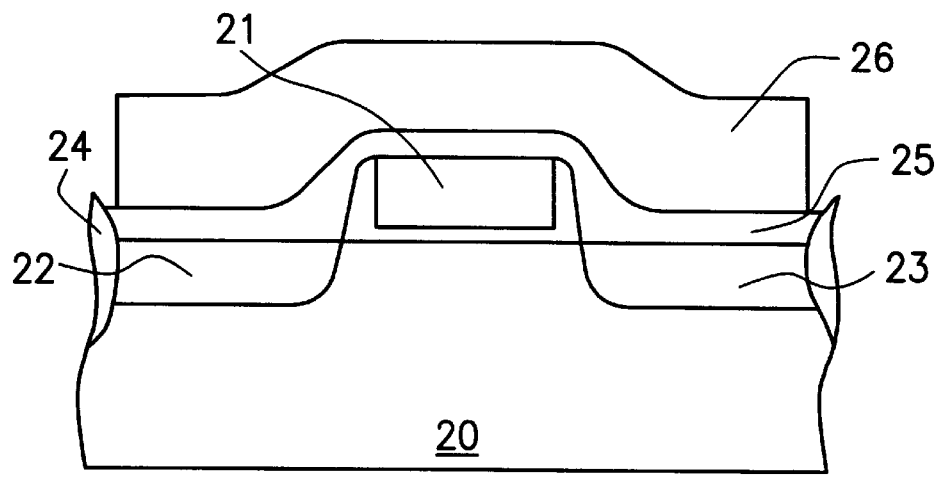
Figure 2C:
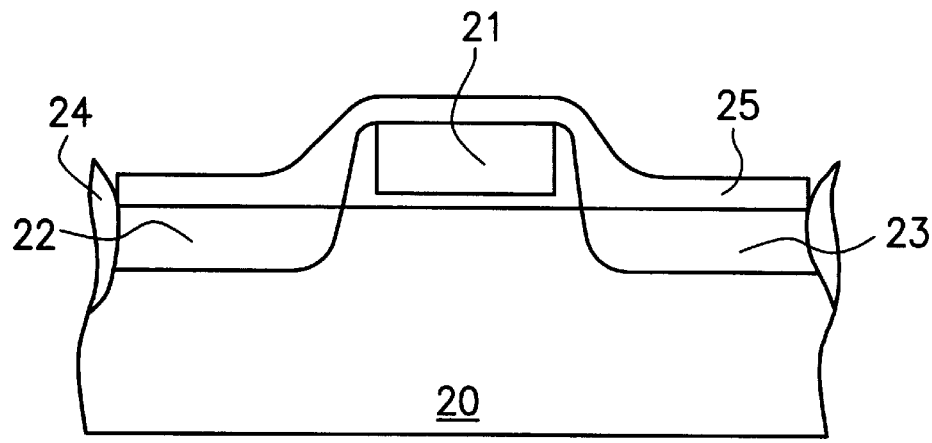

Reference will now be made in detail to the present preferred embodiments of the invention, examples of which are illustrated in the accompanying drawings. Wherever possible, the same reference numbers are used in the drawings and the description to refer to the same or like parts.

The main characteristic of this invention is that a polishing step and an etching step are used in combination in the production of the electrostatic discharge protection device. The first polishing operation removes the insulating layer above the gate, and the second etching operation removes the insulating layer above the source region. Therefore, the insulating layer above the gate and the source region can be completely removed, and leaving only a residual insulating layer above the drain region. The residual insulating layer is used as a mask to prevent the formation of a silicide layer above the drain region. Hence, when subsequent self-aligned processing operation is performed, a silicide layer will only be formed above the gate and the source region, which gives the gate and the source terminal a low resistance. Since there is no silicide layer above the drain region, burnout of the drain terminal due to overheating can be avoided although a high stress voltage is applied. As the level of integration is further increased leading to a reduction in device dimensions, integrity in the region between the gate and the drain terminal can still be maintained. Therefore, the electrostatic discharge protection device can always have a good protection capability.

FIG. 3A through 3E are a series of cross-sectional views showing the progression of steps in the manufacturing of an electrostatic discharge protection device that uses a self-aligned silicide process according to one preferred embodiment of this invention.

Figure 3A:
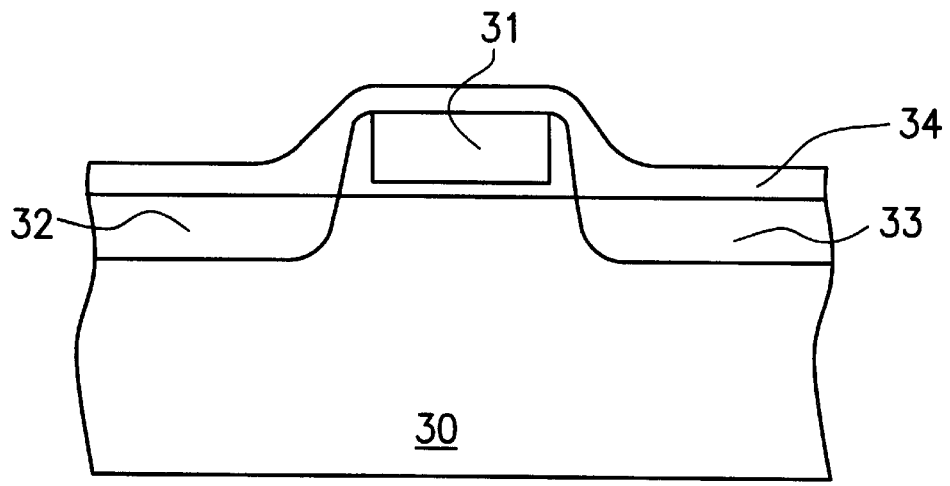
FIG. 3A through 3E are a series of cross-sectional views showing the progression of steps in the manufacturing of an electrostatic discharge protection device that uses a self-aligned silicide process according to one preferred embodiment of this invention.

First, as shown in FIG. 3A, a transistor is formed on a semiconductor substrate 30. The transistor includes a gate 31, a source region 32 and a drain region 33. Then, an insulating layer 34 is formed over the gate 31, the source region 32 and the drain region 33. The insulating layer 34 is preferably an oxide layer, for example, an undoped silicon dioxide ($SiO_2$) layer, formed by depositing oxide to a thickness of about 2000 Å using a chemical vapor deposition (CVD) method.

Figure 3B:
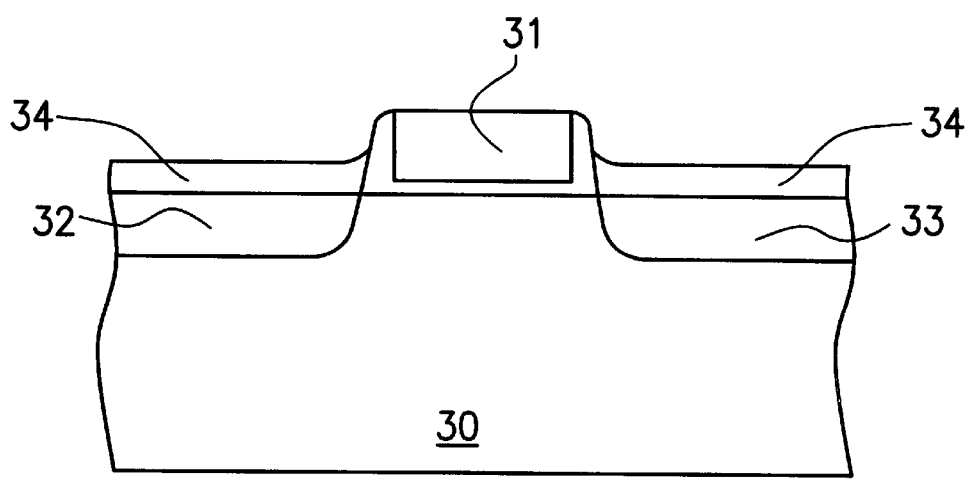

Next, as shown in FIG. 3B, a portion of the insulating layer 34 that lies above the gate 31 is removed. The method is to use chemical-mechanical polishing to polish the insulating layer 34 until the surface of the gate 31 is exposed, thereby leaving no residual insulating layer 34 on top of the gate surface 31.

Figure 3C:
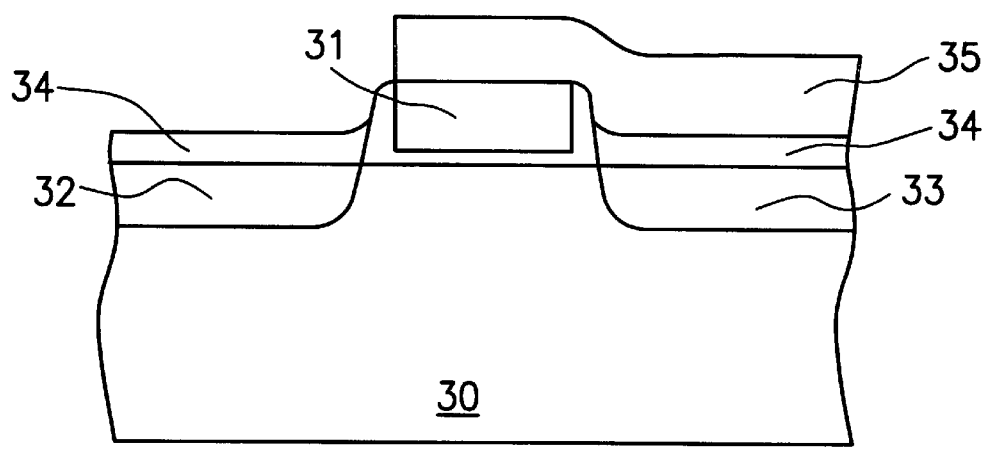

Next, as shown in FIG. 3C, a photolithographic processing operation is performed to form a photoresist layer 35 above the substrate 30. The photoresist layer 35 covers the insulating layer 34 that lies above the gate 31 and the drain region 33, while exposing the insulating layer 34 above the source region 32.

Figure 3D:
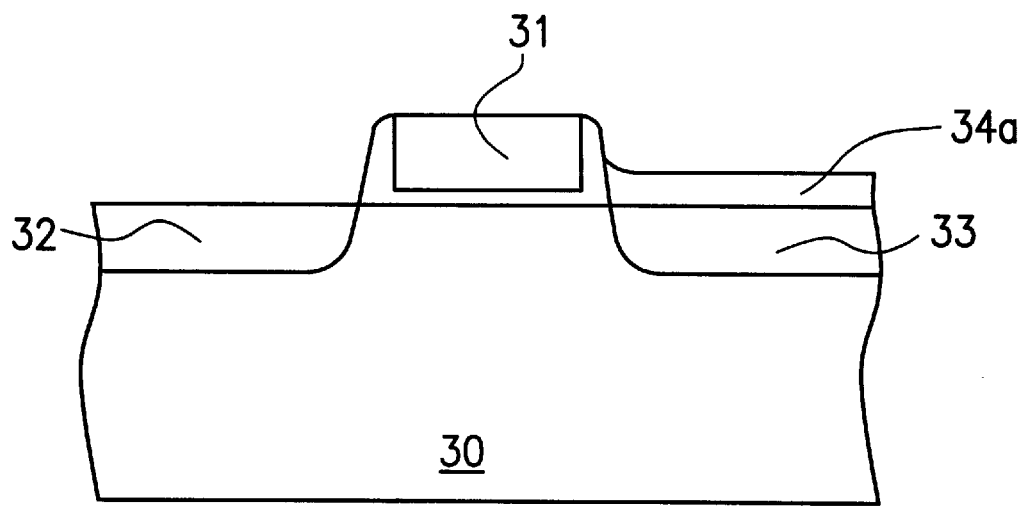

Next, as shown in FIG. 3D, using the photoresist layer 35 as a mask, the exposed insulating layer 34 above the source region 35 is removed, finally leaving only a residual insulating layer 34a above the drain region 33. The exposed insulating layer 34 is removed by an etching method that uses the substrate 30 as a stop layer, so that there is no residual insulating layer 34 on the surface of the source region 32. Thereafter, the photoresist layer 35 is removed.

Figure 3E:
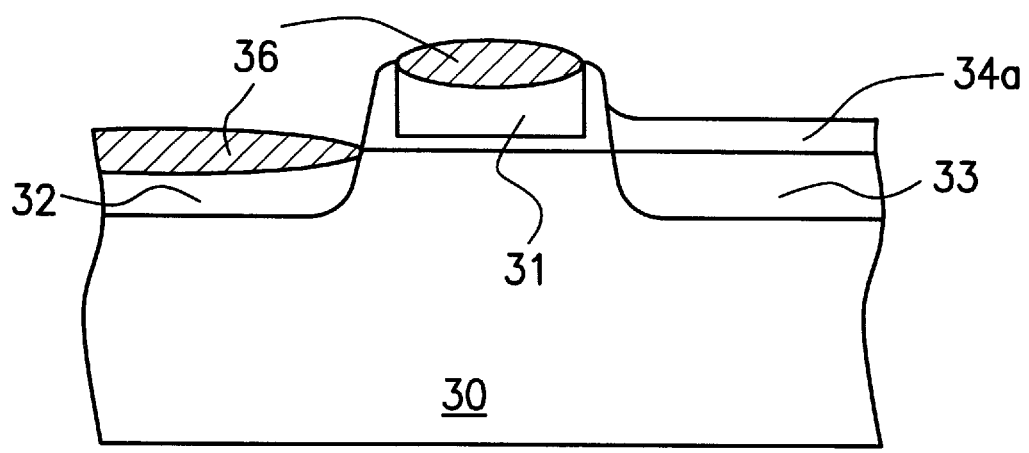

Finally, as shown in FIG. 3E, a self-aligned silicide (Salicide) process is performed to form a silicide layer 36 over the gate 31 and the source region 32. The silicide layer 36 is formed by first depositing a metallic layer, for example, titanium (Ti) or cobalt (Co), over the gate 31, the source region 32 and the residual insulating layer 34a, then performing an annealing operation. At a high temperature, the metal in the metallic layer reacts with the silicon layer below to form a silicide layer 36, for example, a titanium silicide ($TiSi_2$) layer or a cobalt silicide ($CoSi_2$) layer. This completes the formation of the electrostatic discharge protection device structure of this invention. It is obvious from such construction that the silicide layer 36 is formed above the gate 31 and the source region 32 only. No silicide is formed over the drain region 33.

As a summary, the advantages of this invention includes:

(1) The silicide layer is formed above the gate and the source region only, and that there is no silicide layer above the drain region. This means that the gate and the source terminal have low resistance, and at the same time, the drain terminal is capable of avoiding burnout.

(2) As dimensions of devices are reduced, for example, the processing of semiconductors that has a linewidth of less than about 0.25 μm, design rules can still be satisfied. Therefore, reliability of the electrostatic discharge protection device is maintained.

(3) The manufacturing steps required to produce the electrostatic discharge protection device of this invention are simple. Therefore, processing time and processing cost increase are at a minimal.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method for electrostatic discharge protection devices, comprising the steps of:

forming a transistor above a semiconductor substrate, wherein the transistor includes a gate, a source region and a drain region;

forming an insulating layer over the transistor;

removing the insulating layer above the gate;

performing photolithographic processing operation to form a photoresist layer above the substrate such that the photoresist layer covers the insulating layer above the gate and the drain region, while exposing the insulating layer above the source region;

removing the exposed insulating layer above the source region using the photoresist layer as a mask;

removing the photoresist layer; and performing a self-aligned silicide processing operation to form a silicide layer over the gate and the source region.

2. The method of claim 1, wherein the insulating layer has a thickness of about 2000 Å.

3. The method of claim 1, wherein the step of forming the insulating layer includes depositing oxide.

4. The method of claim 1, wherein the step of removing the insulating layer above the gate includes using a chemical-mechanical polishing method to polish the insulating layer until the gate surface is reached, such that no residual insulating layer is left on the gate surface.

5. The method of claim 1, wherein the step of removing the exposed insulating layer above the source region includes using an etching method with the substrate as a stop layer, such that no residual insulating layer is left on the surface of the source region.

6. The method of claim 1, wherein the step of forming a silicide layer includes reacting with titanium to form titanium silicide.

7. The method of claim 1, wherein the step of forming a silicide layer includes reacting with cobalt to form cobalt silicide.

8. The method of claim 1, wherein the step of forming the silicide layer includes first laying a metallic layer over the gate and the source region, and then performing a thermal annealing operation, thereby enabling the metal in the metallic layer to react with the silicon below to form a silicide layer.

\* \* \* \* \*